(12) United States Patent
Zhan et al.

(10) Patent No.: US 11,961,817 B2
(45) Date of Patent: Apr. 16, 2024

(54) APPARATUS AND METHOD FOR FORMING A PACKAGE STRUCTURE

(71) Applicant: Taiwan Semiconductor Manufacturing Company, Ltd., Hsinchu (TW)

(72) Inventors: Kai Jun Zhan, Taoyuan (TW); Chang-Jung Hsueh, Taipei (TW); Hui-Min Huang, Taoyuan (TW); Wei-Hung Lin, Xinfeng Township (TW); Ming-Da Cheng, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 200 days.

(21) Appl. No.: 17/370,249

(22) Filed: Jul. 8, 2021

(65) Prior Publication Data
US 2022/0278071 A1    Sep. 1, 2022

Related U.S. Application Data

(60) Provisional application No. 63/154,031, filed on Feb. 26, 2021.

(51) Int. Cl.
*H01L 23/00* (2006.01)
(52) U.S. Cl.
CPC .............. *H01L 24/75* (2013.01); *H01L 24/81* (2013.01); *H01L 2224/75283* (2013.01);
(Continued)

(58) Field of Classification Search
CPC ... H01L 21/4882; H01L 21/52; H01L 21/566; H01L 21/67121; H01L 21/67126; H01L 21/6838; H01L 21/687; H01L 21/68742; H01L 2023/4087; H01L 23/34; H01L 24/75; H01L 2224/75251; H01L 2224/75745; H01L 2224/75283;
(Continued)

(56) References Cited

U.S. PATENT DOCUMENTS

| 4,875,279 | A | * | 10/1989 | Sakiadis | ............... | H01L 24/743 |
| | | | | | | 156/497 |
| 5,092,954 | A | * | 3/1992 | Braun | ............... | B29C 66/81457 |
| | | | | | | 156/247 |

(Continued)

*Primary Examiner* — David A Zarneke
(74) *Attorney, Agent, or Firm* — McClure, Qualey & Rodack, LLP

(57) ABSTRACT

An apparatus for forming a package structure is provided. The apparatus includes a processing chamber for bonding a first package component and a second package component. The apparatus also includes a bonding head disposed in the processing chamber. The bonding head includes a plurality of vacuum tubes communicating with a plurality of vacuum devices. The apparatus further includes a nozzle connected to the bonding head and configured to hold the second package component. The nozzle includes a plurality of first holes that overlap the vacuum tubes. The nozzle also includes a plurality of second holes offset from the first holes, wherein the second holes overlap at least two edges of the second package component. In addition, the apparatus includes a chuck table disposed in the processing chamber, and the chuck table is configured to hold and heat the first package component.

20 Claims, 11 Drawing Sheets

(52) U.S. Cl.
CPC ............... *H01L 2224/755* (2013.01); *H01L 2224/75745* (2013.01); *H01L 2224/75804* (2013.01); *H01L 2224/81024* (2013.01); *H01L 2224/8123* (2013.01)

(58) Field of Classification Search
CPC ......... H01L 2224/755; H01L 2224/759; H01L 2224/8009; H01L 2224/8109; H01L 2224/75102; H01L 2224/76745; H01L 2224/77745
See application file for complete search history.

(56) References Cited

U.S. PATENT DOCUMENTS

| | | | | |
|---|---|---|---|---|
| 5,273,553 | A * | 12/1993 | Hoshi | H01L 21/6838 257/E21.705 |
| 5,351,876 | A * | 10/1994 | Belcher | H01L 24/75 228/49.1 |
| 7,875,496 | B2 * | 1/2011 | Nakatani | H01L 23/3135 257/737 |
| 8,651,359 | B2 * | 2/2014 | Gaynes | H01L 24/75 228/49.5 |
| 8,720,519 | B2 * | 5/2014 | Yamakami | H01L 24/75 156/60 |
| 9,685,187 | B1 * | 6/2017 | Ouyang | B32B 38/10 |
| 9,842,823 | B2 * | 12/2017 | Yu | H01L 24/75 |
| 10,157,676 | B2 * | 12/2018 | Pang | G11C 16/30 |
| 10,192,770 | B2 * | 1/2019 | Yudovsky | H01L 21/68764 |
| 10,438,920 | B2 * | 10/2019 | Otsuka | H01L 24/80 |
| 10,763,127 | B2 * | 9/2020 | Wakabayashi | H01L 21/2686 |
| 10,840,213 | B2 * | 11/2020 | Matsunaga | H01L 24/75 |
| 10,971,352 | B2 * | 4/2021 | Wu | H01L 21/6838 |
| 10,985,132 | B2 * | 4/2021 | Otsuka | H01L 24/83 |
| 11,024,596 | B2 * | 6/2021 | Watanabe | B29C 65/1435 |
| 11,373,975 | B2 * | 6/2022 | Seyama | H01L 24/75 |
| 11,440,117 | B2 * | 9/2022 | Zhang | H01L 21/681 |
| 11,521,950 | B2 * | 12/2022 | Kurosawa | H01L 24/81 |
| 11,607,741 | B2 * | 3/2023 | Choi | H01L 21/563 |
| 2003/0115747 | A1 * | 6/2003 | Schnetzler | H01L 21/6838 29/830 |
| 2006/0245906 | A1 * | 11/2006 | Pelzmann | H01L 21/67109 414/744.8 |
| 2008/0068580 | A1 * | 3/2008 | Mori | H01L 21/68742 355/72 |
| 2010/0133735 | A1 * | 6/2010 | Katsuta | B23Q 3/088 269/21 |
| 2020/0020521 | A1 * | 1/2020 | Wu | H01L 21/68742 |

\* cited by examiner

APPARATUS AND METHOD FOR FORMING A PACKAGE STRUCTURE

CROSS REFERENCE TO RELATED APPLICATIONS

This application claims the benefit of U.S. Provisional Application No. 63/154,031, filed Feb. 26, 2021, the entirety of which is incorporated by reference herein.

BACKGROUND

Three dimensional integrated circuit (3D IC) technology is emerging as a new scheme for IC fabrication and system integration, to combine mixed technologies for achieving high-density integration with small form factor, high performance and low power consumption. In addition, 3D IC is a promising solution to the limitations of Moore's law. Vertical interconnection often utilizes a 3D integration structure, chip to chip (C2C) bonding, chip to wafer (C2W) bonding, wafer to wafer (W2W) bonding, package to substrate bonding, or the like. Although existing processing apparatuses fir such bonding have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
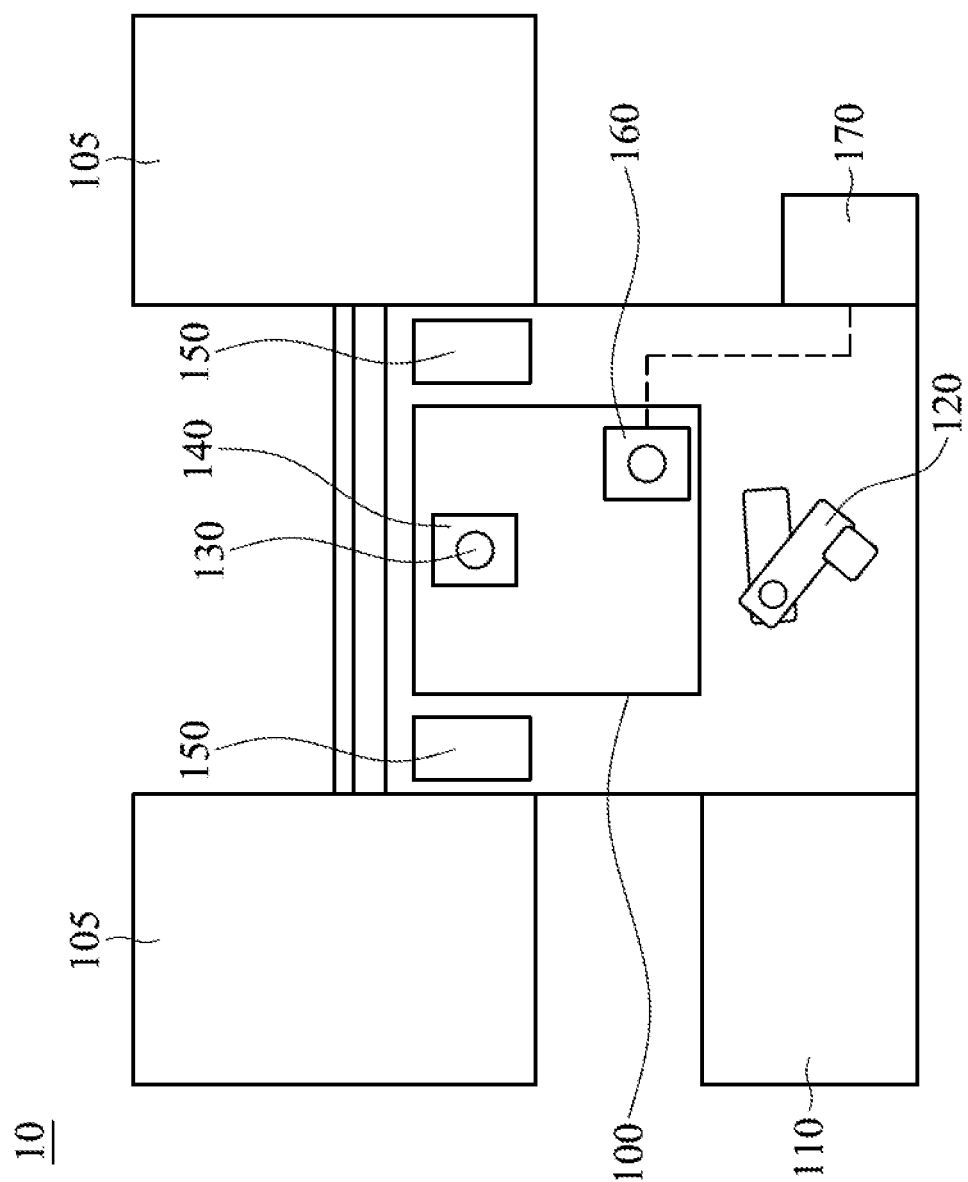
FIG. 1 illustrates a schematic view of a processing apparatus in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments of processing apparatus are provided. The processing apparatus includes a bonding head with a plurality of vacuum tubes communicating to different vacuum. As such, the package component can be held more stably and the yield of the processing apparatus can be increased. In addition, the processing apparatus further includes a plurality of movable pins disposed in the chuck table. The pins are configured to receive package components and keep them away from the heated chuck table so that the flux on the package components is protected. Otherwise, the processing apparatus includes a temperature-control element disposed in the chuck table. The temperature-control element controls the temperature of the chuck table quickly enough to protect the flux on the package components.

Figure 8:
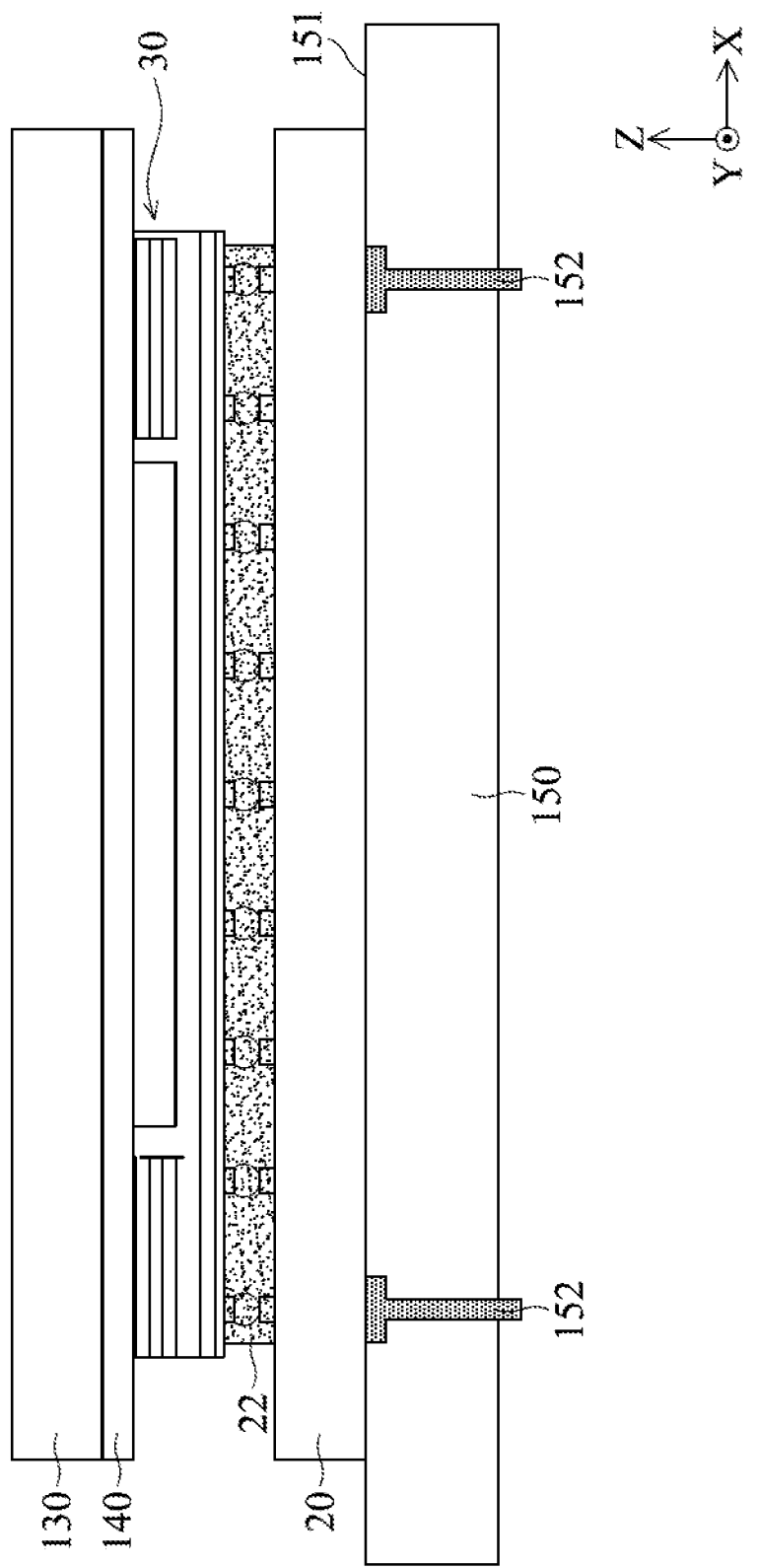

FIG. 1 illustrates a schematic view of a processing apparatus 10 in accordance with some embodiments. In some embodiments, the processing apparatus 10 is configured to form a package structure, for example, performing a bonding process to bond a first package component. 20 and a second package component. 30 (such as shown in FIG. 8). In some embodiments, the processing apparatus 10 can be used for a chip to wafer (C2 W) bonding process. During the bonding process, electrical connectors at a bonding surface of a first package component 20 (e.g., a device wafer or an interposer wafer) are bonded to electrical connectors at a bonding surface of a second package component 30 (e.g., a semiconductor chip).

In some embodiments, the processing apparatus 10 includes a processing chamber 100, a component feeding module 110, and a component transfer module 120. The processing chamber 100 is configured to performing the bonding process therein. The component feeding module 110 is configured to supply and/or store second package components 30, and the component transfer module 120 is configured to transfer the second package components 30 from the component feeding module 110 to the processing chamber 100. For example, in some embodiments, the component transfer module 120 is a robotic arm or any other suitable transfer device that may move smoothly along any of a horizontal, vertical, and/or rotational direction so as to transfer the second package components 30 between the component feeding module 110 and the processing chamber 100.

In some embodiments, the processing apparatus 10 further includes a bonding head 130 and a nozzle 140 connected to the bonding head 130. In some embodiments, the bonding head 130 and the nozzle 140 are configured to receive the second package components 30 from the component transfer module 120. The detail structure of the bonding head 130 and the nozzle 140 will be discussed in the following description. In some embodiments, the bonding head 130 and the nozzle 140 introduce a vacuum pressure to hold the second package components 30 thereon. Similarly, the bonding head 130 and the nozzle 140 may move smoothly along any of a horizontal, vertical, and/or rotational direction so as to hold and move the second package components 30 in the processing chamber 100.

In some embodiments, the processing apparatus 10 further includes a heating module 160 disposed in the processing chamber 100. The heating module 160 is configured to heat the second package components 30 during the transfer of the second package components 30. In some embodiments, the heating module 160 heats the second package components 30 after the second package components 30 are transferred into the processing chamber 100. In some embodiments, the heating module 160 emits radiation towards the second package components 30. In some embodiments, the heating module 160 is an infrared (IR) lamp module and emits infrared rays with a wavelength in a range from about 760 nm to about 1 mm. The heating module 160 heats the second package components 30 in a temperature from room temperature to about 250° C. before the bonding process is performed. Accordingly, the temperature of the second package components 30 reaches the target temperature (for example, about 250° C.) more rapidly, increasing the yield of the processing apparatus 10. In some embodiments, the heating module 160 has a heating area corresponding to a surface area of single second package component 30. For example, the heating area of the heating module 160 is not greater than 70×70 mm². Accordingly, the heating efficiency of the heating module 160 is enhanced, and the energy consumption of the heating module 160 is controlled to an acceptable degree.

The processing apparatus 10 further includes a cooling module 170 connected to the heating module 160 for controlling the temperature of the heating module 160 so as to further control the temperature of the second package components 30. In some embodiments, the cooling module 170 includes a coolant (not shown) circulating inside the cooling module 170, and the flow rate of the coolant is in a range from 0 to 4 liter per minute (LPM). In some embodiments, the coolant is any suitable coolant that is suitable at a temperature below 200° C. For example, the coolant may include distilled water. In some embodiments, the pH value of the coolant is in a range from about 6 to about 7. The arrangement of the cooling module 170 helps to reduce the possibility that the heating module 160 overheats and damages the second package components 30.

In some embodiments, the processing apparatus 10 further includes a plurality of component storage modules 105 and a plurality of chuck tables 150. The component storage modules 105 are configured to supply and/or store first package components 20. In some embodiments, the processing apparatus 10 further includes a carrier (for example, a carrier 107 shown in FIG. 5) to transfer the first package components 20 from the component storage modules 105 to the chuck table 150. The chuck tables 150 are configured to hold the first package components 20 for subsequent bonding process. In some embodiments, the chuck tables 150 with the first package components 20 held thereon are transferred into the processing chamber 100 for the subsequent bonding process. Although multiple component storage modules 105 and chuck tables 150 shown in the present embodiment, the number of the component storage modules 105 and chuck tables 150 is not limited thereto and adjustable by those skilled in the art. In some embodiments, the chuck tables 150 are made of an insulating material (e.g., a ceramic material or a glass material), so as to avoid undesired absorption of induction power.

Figure 2:
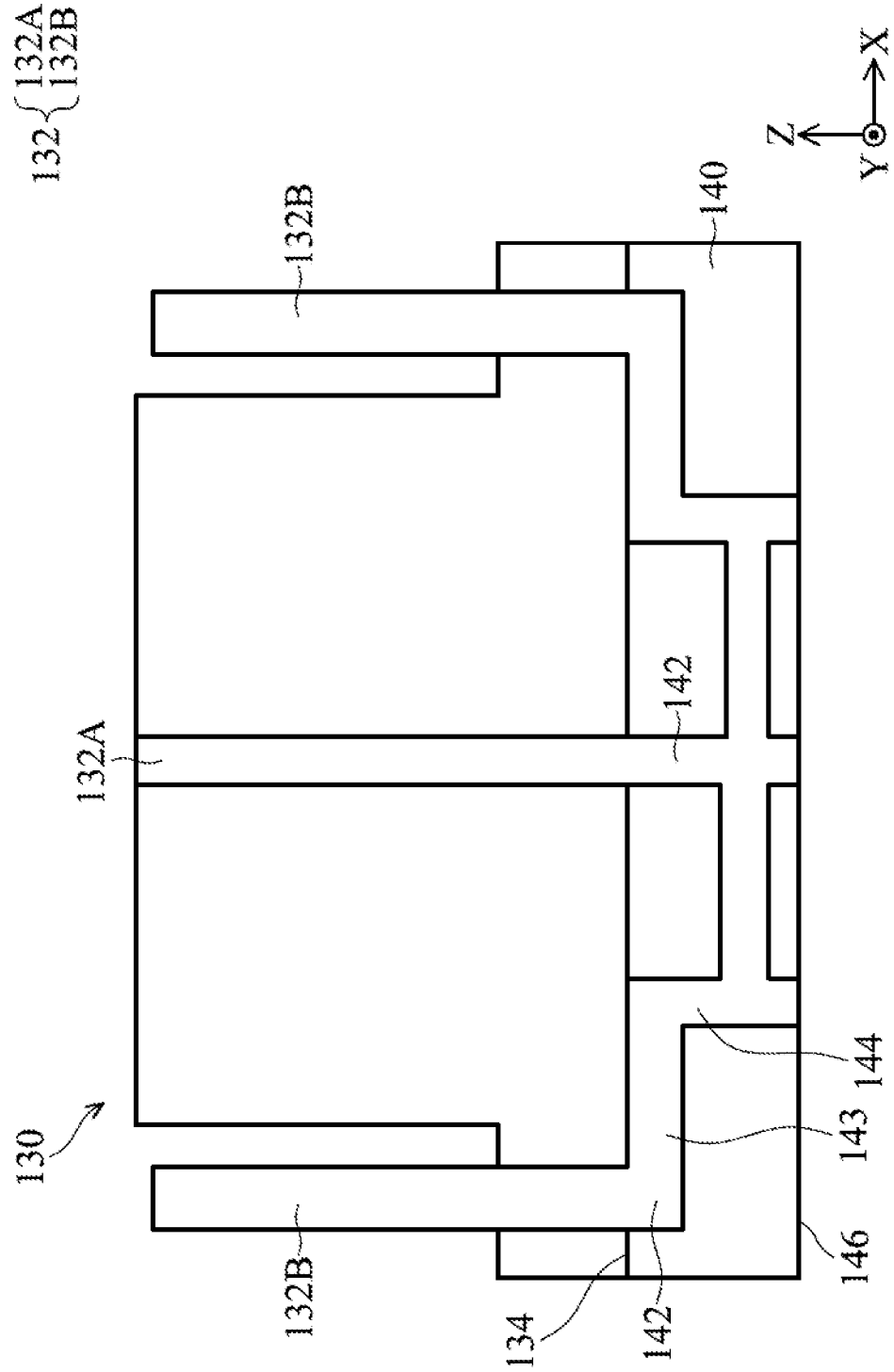
FIG. 2 illustrates a cross-sectional view of a bonding head and a nozzle in accordance with some embodiments.

FIG. 2 illustrates a cross-sectional view of the bonding head 130 and the nozzle 140 in accordance with some embodiments. In some embodiments, the bonding head 130 includes a plurality of vacuum tubes 132. The vacuum tubes 132 further include a first vacuum tube 132A and second vacuum tubes 132B. In some embodiments, the first vacuum tube 132A communicates with a vacuum device (not shown) that is inherently disposed in the bonding head 130. The second vacuum tubes 132B each communicates with an external vacuum device (not shown) that is different from the vacuum device disposed in the bonding head 130. It should be noted that all the above vacuum devices could operate independently from each other. For example, the vacuum pressure supplied by the vacuum devices can be different. In some embodiments, the vacuum pressure of the vacuum devices is in a range from 0 to about −95 kPa so as to provide sufficient force to hold the second package component 30. Since extra vacuum devices are communicated to the bonding head 130, the second package component 30 is transferred more rapidly and firmly. Therefore, the yield of the processing apparatus 10 is increased and the planarity of the second package component 30 is also improved.

In some embodiments, the nozzle 140 is connected to the bonding head 130, and an interface 134 is formed between the nozzle 140 and the bonding head 130. The nozzle 140 is configured to contact and hold the second package component 30 on a lower surface 146 of the nozzle 140. The lower surface 146 of the nozzle 140 is opposite to the interface 134. In some embodiments, the nozzle 140 has a plurality of first holes 142 formed on the interface 134, and a plurality of second holes 144 formed on the lower surface 146 of the nozzle 140. The first holes 142 overlap the vacuum tubes 132, and therefore the bonding head 130 communicates with the nozzle 140. In some embodiments, the second holes 144 are offset from the first holes 142. To be more specific, the second holes 144 are offset from and communicate with the first holes 142 below the second vacuum tubes 132B. A trench 143 is formed to communicate the misaligned first holes 142 and second holes 144. In some embodiments, the trench 143 extends along and is exposed from the interface 134, as shown in FIG. 2. In some embodiments, the trench 143 is embedded in the nozzle 140. In some embodiments, the dimension (such as depth or width) of the trench 143 is in a range from about 0.1 mm to about 5 mm. The depth or width of the trench 143 is measured in the Z direction or the Y direction. The trench 143 is designed to communicate the first hole 142 with the second hole 144 so that the vacuum pressure also exists in the second hole 144 for holding the second package component 30. If the dimension of the trench 143 is too large, the vacuum pressure for holding the second package component 30 would be insufficient. On the other hand, if the dimension of the trench 143 is too small, the connection between the first hole 142 and the second hole 144 would be obstructed.

Figure 3:
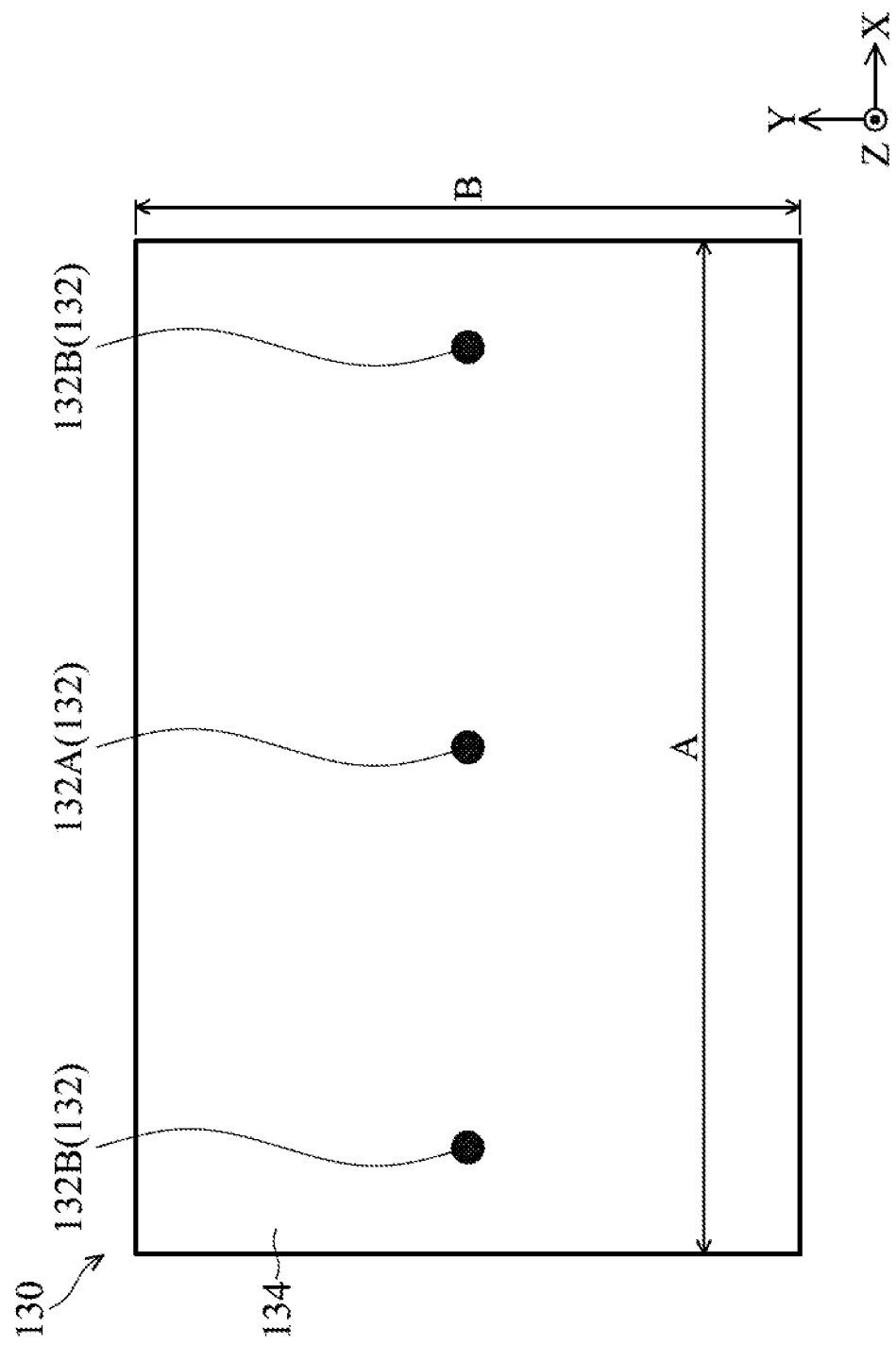
FIG. 3 illustrates a plan view of the bonding head in accordance with some embodiments.

FIG. 3 illustrates a plan view of the bonding head 130 in accordance with some embodiments. This plan view is illustrated and viewed from the interface 134, which is substantially parallel to the X-Y plane. In some embodiments, the bonding head 130 has a length A in a lengthwise direction (such as the X direction) and has a width B in a widthwise direction (such as the Y direction). Since the bonding head 130 includes multiple vacuum tubes 132 (including the first vacuum tube 132A and the second vacuum tubes 132B), the length A has to be long enough to contain the vacuum tubes 132. In some embodiments, the length A is greater than the width B, which is substantially equal to about 75 mm, and therefore the surface area of the bonding head 130 is greater than 75×75 mm². In some embodiments, the first vacuum tube 132A is located at half of the distance between two adjacent second vacuum tubes 132B. Accordingly, the force for holding the second package component 30 is more uniform and controllable. In some embodiments, a distance between the first vacuum tube 132A and one of the adjacent second vacuum tubes 132B is different from a distance between the first vacuum tube 132A and the other of the adjacent second vacuum tubes 132B.

Figure 4:
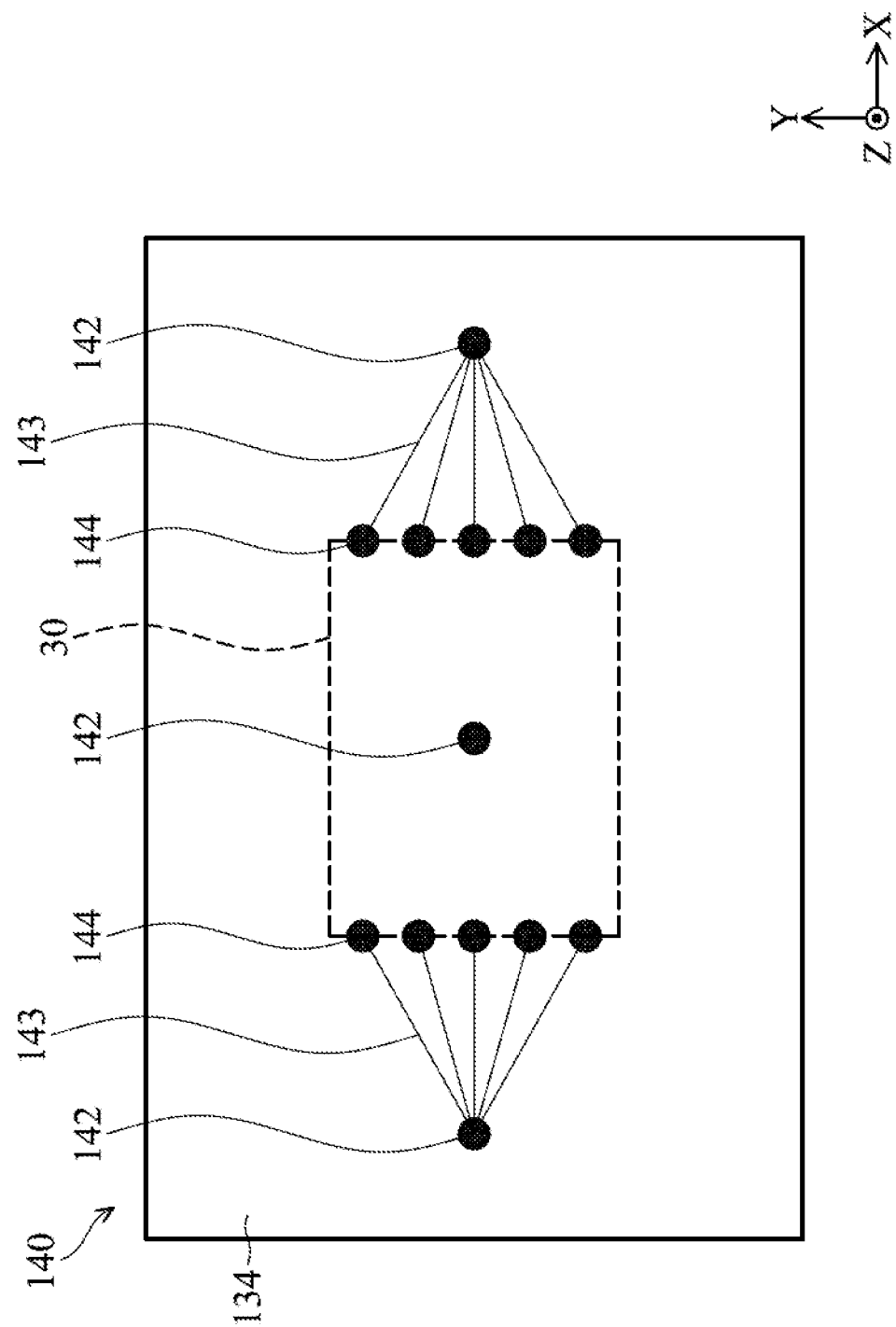
FIG. 4 illustrates a plan view of the nozzle in accordance with some embodiments.

FIG. 4 illustrates a plan view of the nozzle 140 in accordance with some embodiments. This plan view is illustrated and viewed from the interface 134, which is substantially parallel to the X-Y plane. In some embodiments, the nozzle 140 has a plurality of second holes 144 aligned with an edge of the second package component 30, and therefore the second holes 144 are arranged linearly (for example, substantially parallel to the Y direction). In some embodiments, the number of the second holes 144 is greater than the number of the first holes 142. It is noted that the second package component 30 is located on the lower surface 146 (shown in FIG. 2) that is opposite to the interface 134, and therefore the second package component 30 is illustrated in dotted lines.

In some embodiments, single trench 143 is formed between respective first hole 142 and second hole 144. Accordingly, one first hole 142 communicates with multiple second holes 144 via different trenches 143. Therefore, the vacuum pressure also exists in the second holes 144. In some embodiments, multiple second holes 144 communicate with the first hole 142 via merely one trench 143. Since the second holes 144 are aligned with edges of the second package component 30, the edges of the second package component 30 are also firmly held by the bonding head 130 and the nozzle 140. As such, the second package components 30 can be held faster, increasing the yield of the processing apparatus 10. It is more efficient to hold the second package component 30 with a certain area by using the disclosed bonding head 130 and the nozzle 140. In some embodiments, the area of the second package component 30 is not less than 30×40 mm$^2$. In response to the above size of the second package component 30, the area of the first package component 20 is not less than 60×60 mm$^2$. The areas of the first package component 20 and the second package component 30 may be measured in a plane that is substantially parallel to the X-Y plane. However, it is not intended to limit the present disclosure to the above dimensions.

Figure 5:
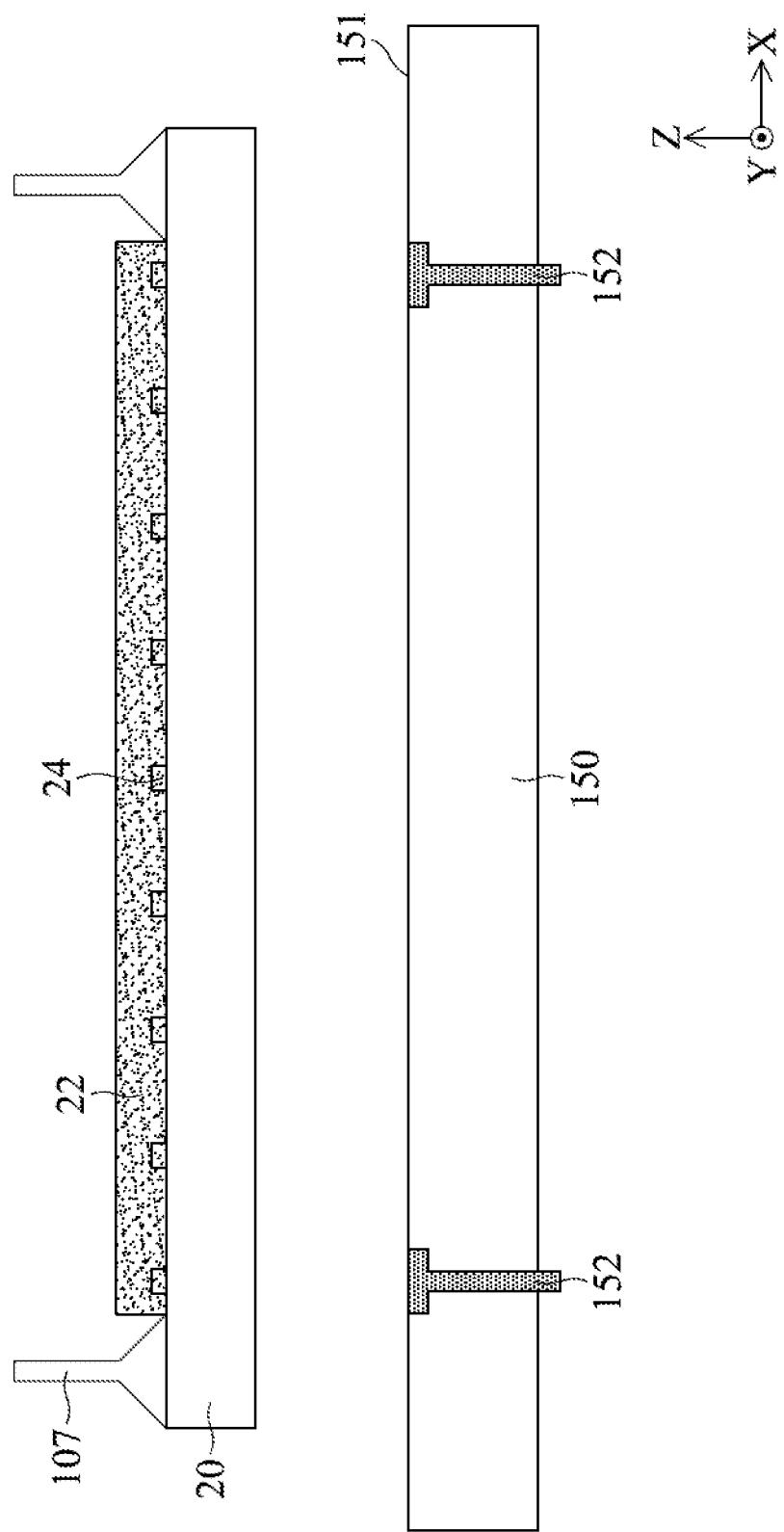
FIGS. 5 through 8 illustrate cross-sectional views of intermediate steps of a method for forming a package structure in accordance with some embodiments.

FIGS. 5 through 8 illustrate cross-sectional views of intermediate steps of a method for forming a package structure in accordance with some embodiments. As shown in FIG. 5, the first package component 20 is held and positioned by a carrier 107. The carrier 107 is configured to transfer the first package component 20 from the component storage module 105 to the chuck table 150. In some embodiments, the first package component 20 includes a plurality of electrical connectors 24, and flux 22 is formed on the electrical connectors 24 for bonding to the second package component 30 (shown in FIG. 8). In some embodiments, the chuck table 150 has a top surface 151 and includes a plurality of pins 152 for holding the first package component 20. In some embodiments, the chuck table 150 is heated to about 250° C. for performing the bonding process. In some embodiments, the temperature of the chuck table 150 is in a range from room temperature to about 250° C.

Figure 6:
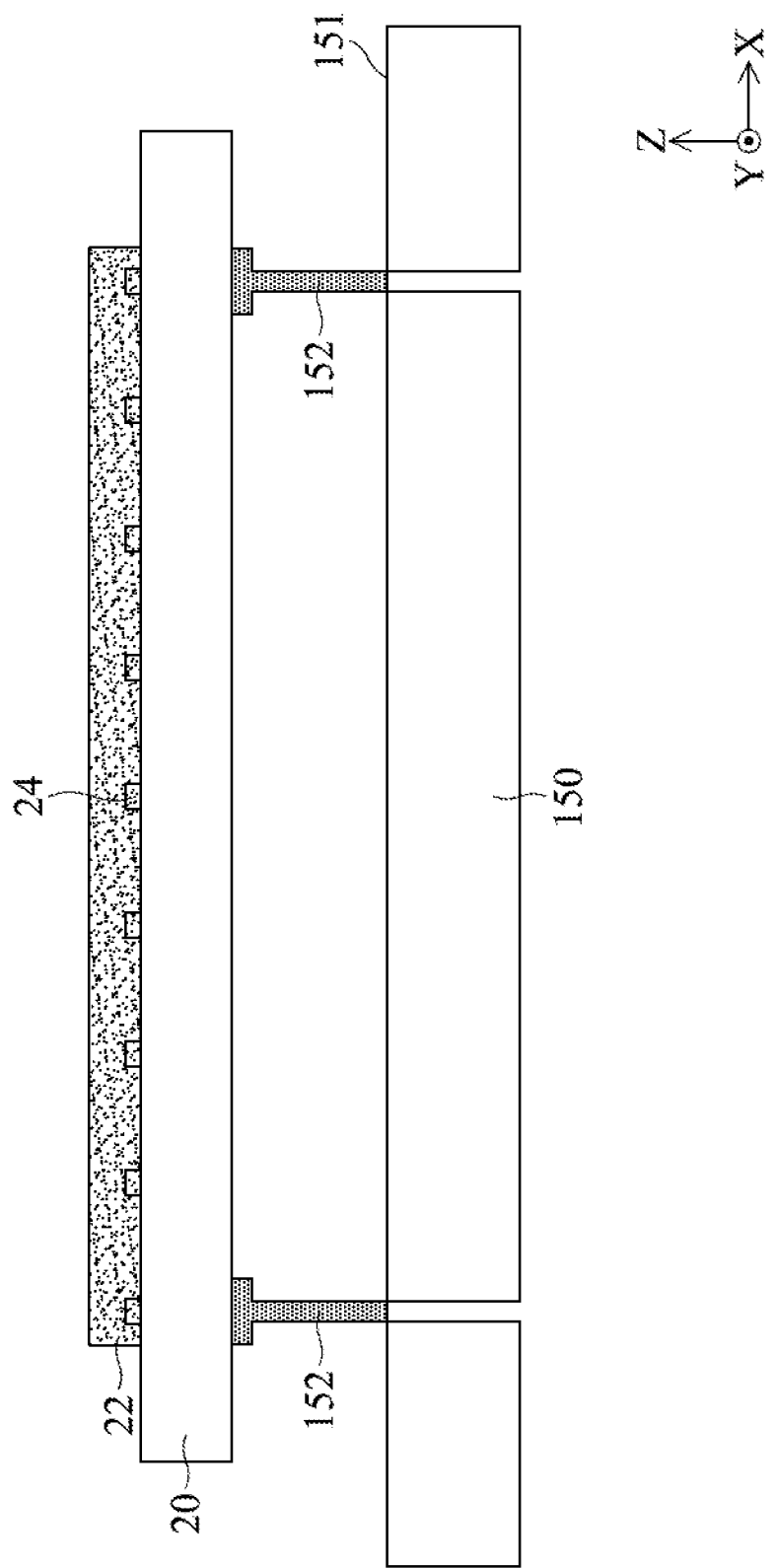

Next, as shown in FIG. 6, the pins 152 moves upwards relative to the chuck table 150 to receive the first package component 20. In some embodiments, the number of the pins 152 is not less than three. As such, the first package component 20 is stably held by the pins 152. It is noted that the temperature of the chuck table 150 is relatively high (for example, about 250° C.), and the flux 22 is susceptible to heat. The movement of the pins 152 helps to keep the first package component 20 away from the top surface 151 of the heated chuck table 150, and therefore the possibility that the flux 22 degrades due to high temperature of the chuck table 150 is reduced. In some embodiments, the pins 152 move upward substantially along the vertical direction (i.e. the Z direction). However, the pins 152 may also be movable in any direction as long as the pins 152 are capable of holding the first package component 20 over top surface 151 of the heated chuck table 150.

Figure 7:
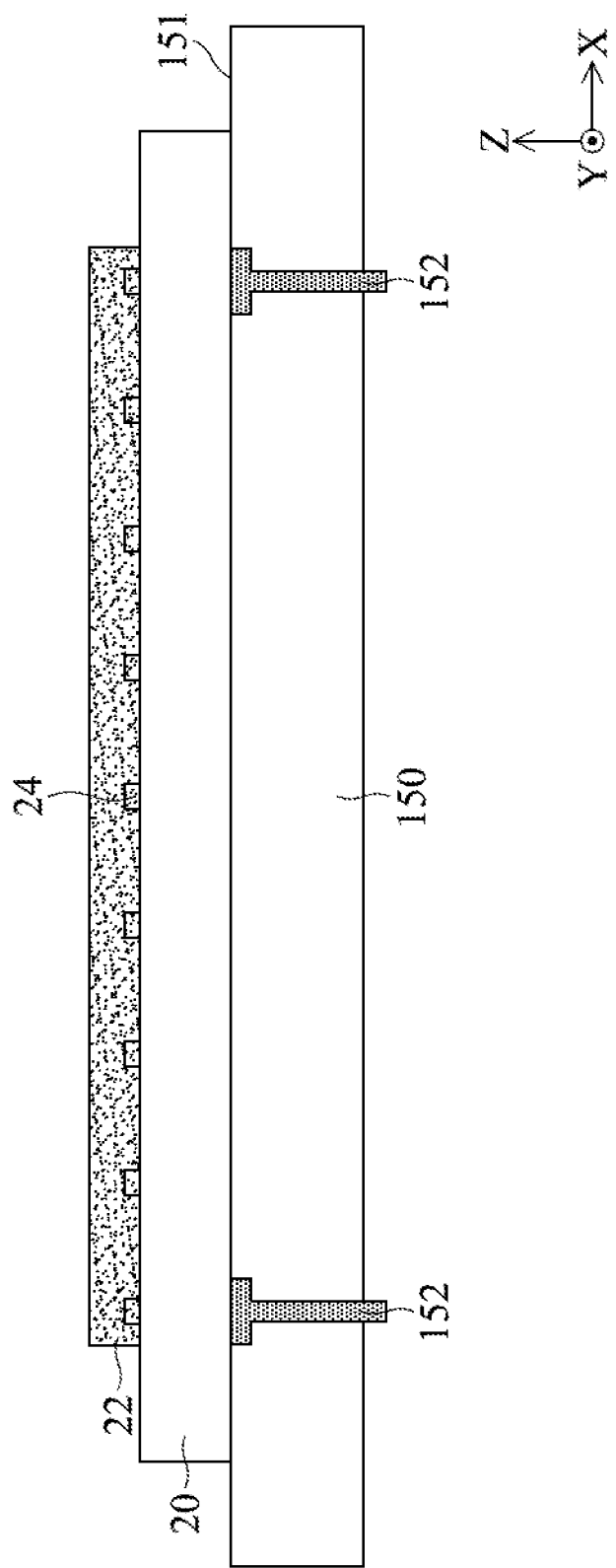

As shown in FIG. 7, the pins 152 moves downwards relative to the chuck table 150 to place the first package component 20 on the top surface 151 of the chuck table 150. Similarly, the pins 152 move downward substantially along the vertical direction (i.e. the Z direction). However, the pins 152 may also be movable in any direction as long as the pins 152 are capable of placing the first package component 20 directly on the top surface 151 of the chuck table 150. At this time, the top surface of the pins 152 is substantially level with the top surface 151 of the chuck table 150, and the pins 152 are contained in the chuck table 150. Accordingly, the time that the first package component 20 stay on the top surface 151 of the chuck table 150 is reduced. Therefore, the flux 22 may be kept from thermal damages as possible. In addition, the arrangement of the pins 152 allows the chuck table 150 maintain at a target temperature for the bonding process without cooling down. The time of the bonding process can also be reduced since the chuck table 150 does not need to be re-heated.

As shown in FIG. 8, the bonding head 130 and the nozzle 140 hold and position the second package component 30 over the chuck table 150. In some embodiments, the second package component 30 is aligned with the first package component 20. That is, the second package component 30 falls within the range of the first package component 20. In some embodiments, the second package component 30 vertically overlaps the top surface of the first package component 20.

In some embodiments, the pins 152 moves downwards while the second package component 30 is positioned above the chuck table 150. As such, the overall proceeding time is reduced, and the yield of the processing apparatus 10 is increased. In some embodiments, the pins 152 moves downwards after the second package component 30 is positioned above the chuck table 150. Accordingly, the time that the first package component 20 stays on the chuck table 150 with relative high temperature is reduced, protecting the flux 22 on the first package component 20 from thermal damage as possible. Then, a bonding process is performed to the first package component 20 and the second package component 30, forming a package structure 50, which will be further discussed in accompany with FIG. 11.

In some embodiments, the bonding head 130 presses the second package component 30 towards the first package component 20. The second package component 30 and the first package component 20 may be bonded together via the electrical connectors (for example, the electrical connectors 24 and 34, shown in FIG. 11) at the target temperature (e.g. about 250° C.) of the bonding process. After the bonding process is completed, the bonding head 130 (and the nozzle 140) moves away from the package structure 50, leaving the package structure 50 on the chuck table 150. Then, the package structure 50 may be transferred to another processing apparatus for subsequent processes. The bonding head 130 may move to receive another second package component 30 and repeat the above bonding process, which will not be further discussed below.

Figure 9:
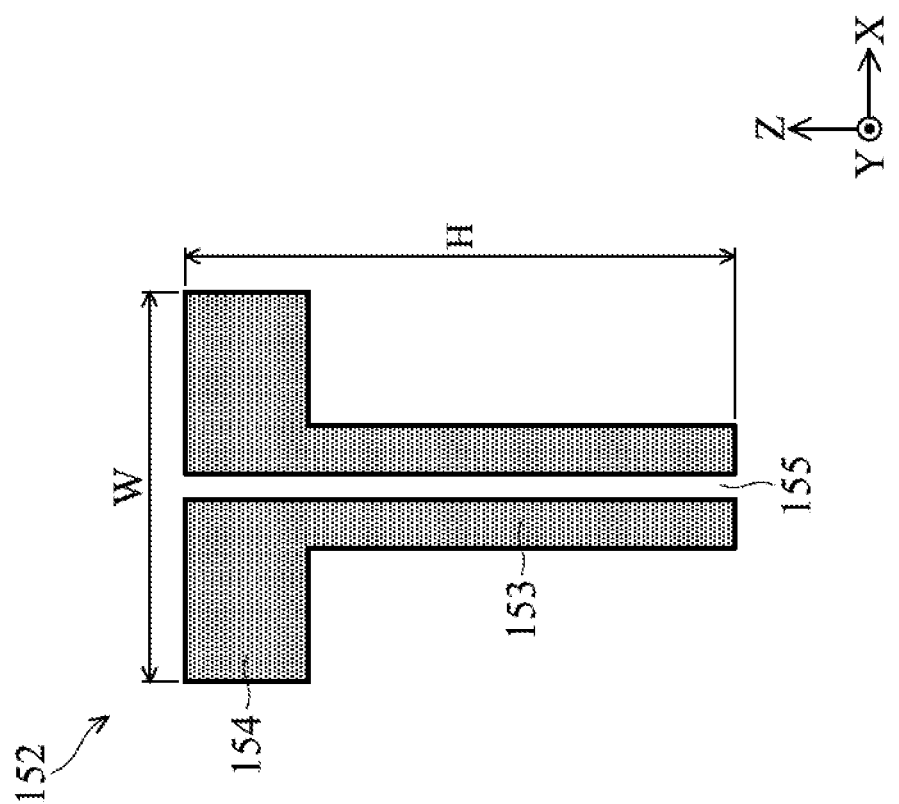
FIG. 9 illustrates a cross-sectional view of a pin in accordance with some embodiments.

FIG. 9 illustrates a cross-sectional view of a pin 152 in accordance with some embodiments. In some embodiments, the pin 152 includes a base portion 153 and a top portion 154 over the base portion 153. The top portion 154 is connected to the base portion 153 and is wider than the base portion 153 for holding the first package component 20. Accordingly, the pin 152 has a T-shape when viewed in a cross-sectional view. In some embodiments, the height of the base portion 153 is greater than the height of the top portion 154. However, the present disclosure is not limited thereto.

An opening 155 is formed in the pin 152 and penetrates the base portion 153 and the top portion 154. In some embodiments, the opening 155 communicates with a vacuum device (not shown). Accordingly, a vacuum pressure exists in the opening 155, and the first package component 20 is stably held on the pins 152. In some embodiments, the top portion 154 has a width W, the width W is measured in a direction that is substantially parallel to the X-Y plane. In some embodiments, the width W is not less than about 2 mm so as to stably hold the first package component 20 on the pins 152. As such, the possibility that the first package component 20 falls from the pins 152 is reduced, increasing the yield of the processing apparatus 10. In some embodiments, the pin 152 has a height H, the height H is measured in a direction that is substantially perpendicular to the X-Y plane. In some embodiments, the height H is not less than about 15 mm so as to effectively keep the first package component 20 far enough from the heated chuck table 150 when the bonding process is not performed. It is rioted that although not illustrated, the shape of the pin 152 may be circle, rectangle, or any other suitable shape as viewed in a top view, and those skilled in the art should make arbitrary arrangement (e.g. the shape or the position) of the pins 152 as long as the first package component 20 is stably held. The detail of the arrangement of the pins 152 will not be further discussed below.

Figure 10:
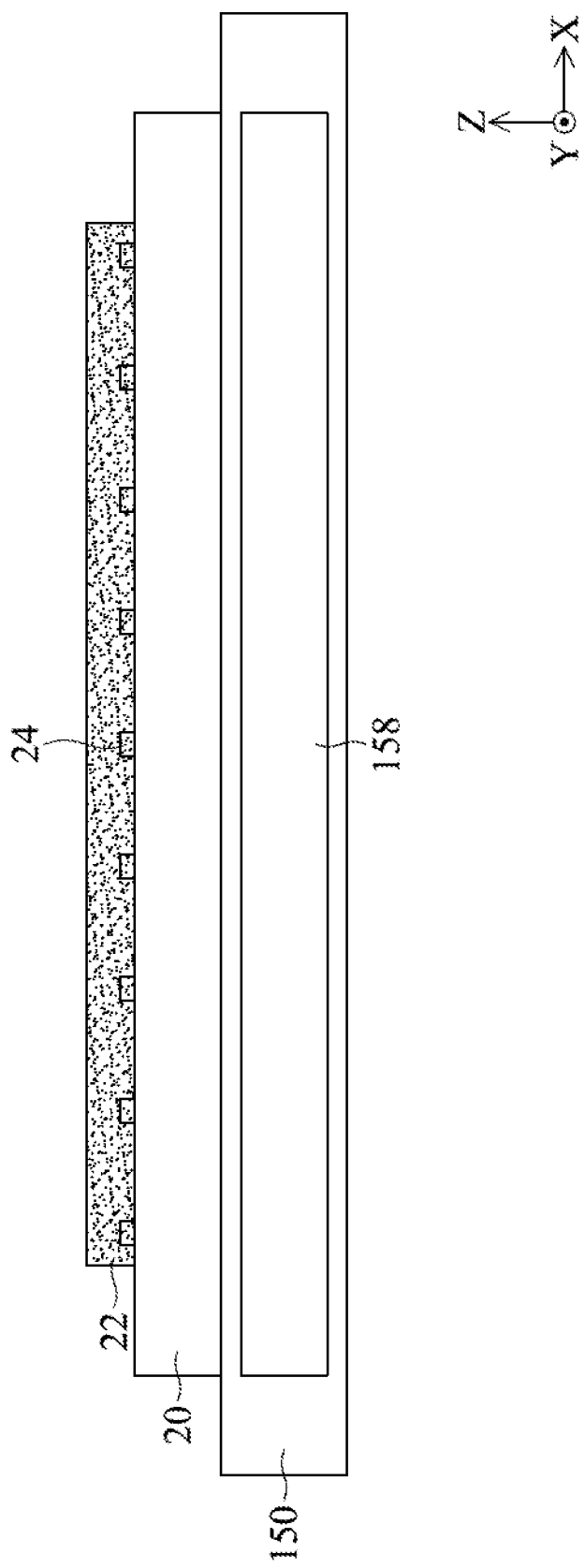
FIG. 10 illustrates a cross-sectional view of a chuck table in accordance with some embodiments.

FIG. 10 illustrates a cross-sectional view of a chuck table 150 in accordance with some embodiments. In some embodiments, the chuck table 150 includes a temperature-control element 158 that is configured to control the temperature of the chuck table 150. For example, the temperature-control element. 158 is a thermoelectric chip or any other suitable device. In some embodiments, the temperature-control element 158 is capable of control the temperature of the chuck table 150 rapidly. As such, before the bonding process is performed, the chuck table 150 is kept at a relative low temperature (i.e. lower than 250° C., for example about 200° C.) by the temperature-control element 158 when the first package component 20 is placed on the chuck table 150. The possibility that the flux 22 on the first package component 20 degrades due to high temperature of the chuck table 150 is reduced. When the bonding process is performed, the chuck table 150 is heated to a relative high temperature (for example, about 250° C.) by the temperature-control element 158 for bonding the second package component 30. Accordingly, the energy consumption for the bonding process is precisely controlled, and the process cost can be lower. In some embodiments, the width of the temperature-control element 158 is substantially the same as the width of the first package component 20. However, the present disclosure is not limited thereto. In some embodiments, the width of the temperature-control element 158 is different from the width of the first package component 20.

Figure 11:
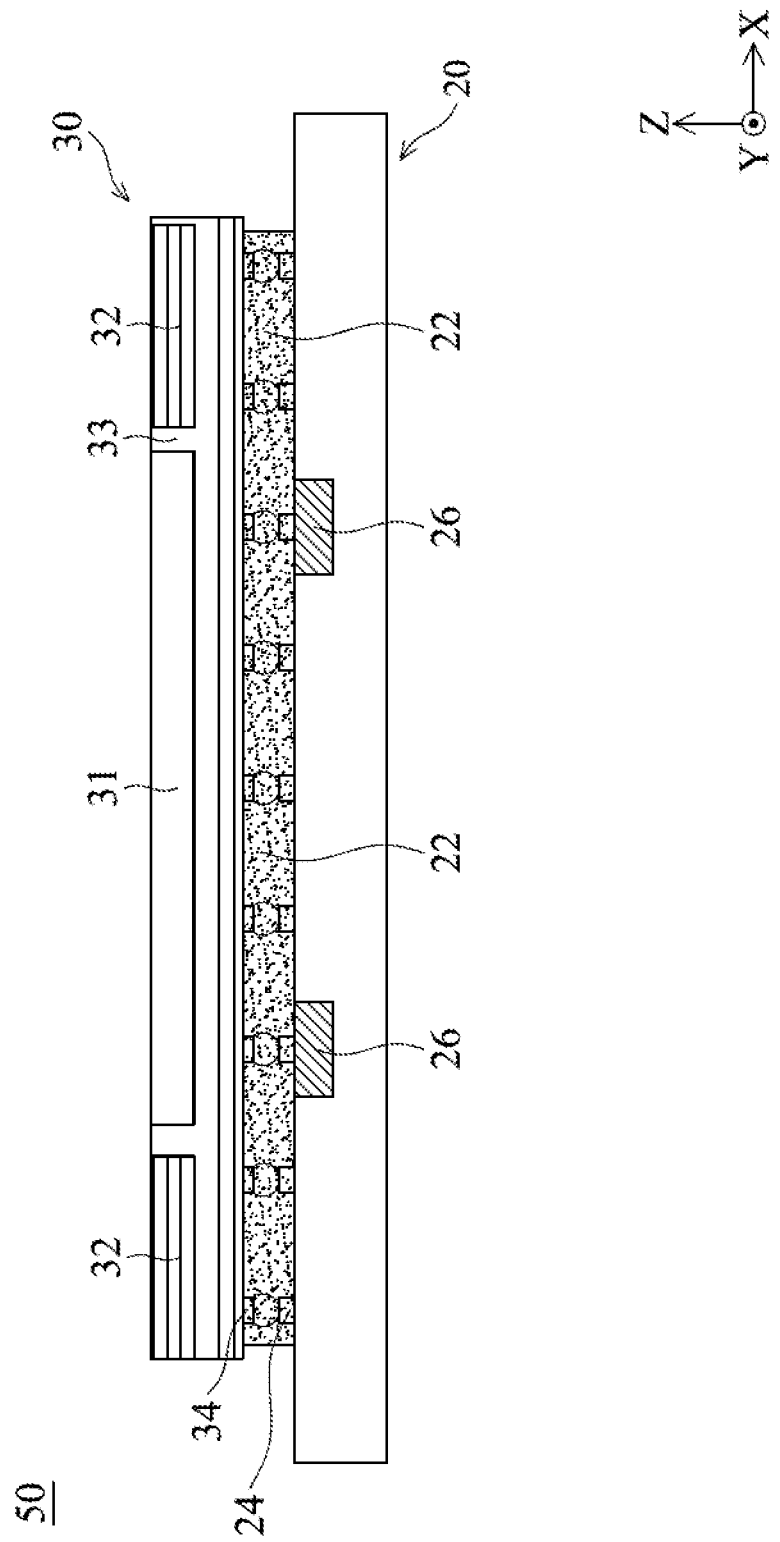
FIG. 11 illustrates a cross-sectional view of the package structure in accordance with some embodiments.

FIG. 11 illustrates a cross-sectional view of the package structure 50 in accordance with some embodiments. In some embodiments, the package structure 50 is formed by the bonded second package component 30 and first package component 20. In some embodiments, the unit warpage of the package structure 50 is not greater than about 50 μm. In some embodiments, the unit thickness of the package structure 50 is not greater than about 500 μm. In some embodiments, the first package component 20 may be formed of a semiconductor material, such as silicon, silicon germanium, silicon carbide, gallium arsenide, or other commonly used semiconductor materials. In some embodiments, the first package component 20 is a device wafer and includes at least one device 26, for example, two devices 26 shown in FIG. 11. The devices 26 include passive devices (such as resistors, capacitors, and inductors) or active devices (such as transistors and diodes).

In some embodiments, the first package component 20 has a plurality of die regions (not individually shown), which could be singulated from the device wafer to form semiconductor chips as respectively similar to the second package component 30 described below. In these embodiments, the first package component 20 has a size much greater than a size of the second package component 30. In some embodiments, the die regions could remain unsingulated in the device wafer. In these embodiments, the first package component 20 has a size substantially corresponding to a size of the second package component 30.

In some embodiments, the first package component 20 is formed of a dielectric material, such as glass, aluminum oxide, aluminum nitride, the like, or a combination thereof. The first package component. 20 is free from passive devices (such as resistors, capacitors, and inductors) or active devices (such as transistors and diodes). In some embodiments, the first package component 20 is an interposer wafer. In other words, the second package component 30 may be bonded to the interposer wafer, rather than being bonded to the device wafer as described above. The interposer wafer is sandwiched between package components (e.g., the semiconductor chip as described above and a package substrate (not shown)) in a finalized package structure (which may be a chip-on-wafer-on-substrate (CoWoS) structure), and configured to interconnect these vertically separated package components. In these embodiments, the interposer wafer also has the electrical connectors 24 electrically connected to interconnection structures and/or through substrate vias (both not shown) formed in the interposer wafer. In addition, the interposer wafer may not have the die regions as described above.

In some embodiments, the second package component 30 is a semiconductor chip. For example, the semiconductor chip may be a logic chip, a memory chip, a sensor chip, a digital chip, an analog chip, a wireless and radio frequency chip, a voltage regulator chip, an application-specific integrated chip (ASIC) or any other type of semiconductor chip. In some embodiments, the second package component 30 includes a chip element 31, at least one device 32, a molding material 33, and a plurality of electrical connectors 34. The material of the chip element 31 includes silicon (Si) or any other suitable material. The devices 32 include passive devices (such as resistors, capacitors, and inductors) or active devices (such as transistors and diodes). In some embodiments, the devices 32 are different from each other and have different functions.

In some embodiments, the molding material 33 connects the chip element 31 and the devices 32. The molding material 33 includes a polymer material or another suitable insulating material. The electrical connectors 34 may be electrically connected to the devices 32 by, for example, through substrate vias (TSVs) and interconnection structures (both not shown). A material of the electrical connectors 34 may include Cu, Al, Ti, Ni, Sn, the like or combinations thereof, and a method for forming the electrical connectors 34 may include a physical vapor deposition (PVD) process, a plating process (e.g., an electroplating process or an electroless plating process) or a combination thereof.

Embodiments of processing apparatus are provided. The processing apparatus includes a bonding head with a plurality of vacuum tubes communicating to different vacuum. As such, the package component can be held more stably and the yield of the processing apparatus can be increased. In addition, the processing apparatus further includes a plurality of movable pins disposed in the chuck table. The pins are configured to receive package components and keep them away from the heated chuck table so that the flux on the package components is protected. Otherwise, the processing apparatus includes a temperature-control element disposed in the chuck table. The temperature-control element controls the temperature of the chuck table quickly enough to protect the flux on the package components. In addition, the processing apparatus includes a heating module to heat the package component in the processing chamber before the bonding process is performed, reducing the time of the bonding process and increasing the yield of the processing apparatus.

In some embodiments, an apparatus for forming a package structure is provided. The apparatus includes a processing chamber for bonding a first package component and a second package component. The apparatus also includes a bonding head disposed in the processing chamber. The bonding head includes a plurality of vacuum tubes communicating with a plurality of vacuum devices. The apparatus further includes a nozzle connected to the bonding head and configured to hold the second package component. The nozzle includes a plurality of first holes that overlap the vacuum tubes. The nozzle also includes a plurality of second holes offset from the first holes, wherein the second holes overlap at least two edges of the second package component. In addition, the apparatus includes a chuck table disposed in the processing chamber. The chuck table is configured to hold and heat the first package component.

In some embodiments, an apparatus for forming a package structure is provided. The apparatus includes a processing chamber for bonding a first package component and a second package component. The apparatus also includes a bonding head disposed in the processing chamber. The bonding head includes a first vacuum tube and a second vacuum tube, the first vacuum tube communicates with a first vacuum device, the second vacuum tube communicates with a second vacuum device, and the first vacuum device and the second vacuum device operate independently. The apparatus further includes a nozzle connected to the bonding head and configured to hold the second package component. The nozzle includes a plurality of first holes overlapping the first vacuum tube and the second vacuum tube. In addition, the apparatus includes a chuck table disposed in the processing chamber configured to hold and heat the first package component.

In some embodiments, a method for forming a package structure is provided. The method includes transporting a first package component into a processing chamber and positioning the first package component on a chuck table. The method also includes the first package component being heated by the chuck table and a second package component being held by a bonding head. The bonding head communicates with a plurality of vacuum devices via a plurality of vacuum tubes. The vacuum devices each operate independently. The method further includes bonding the first package component and the second package component in the processing chamber to form the package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for forming a package structure, comprising:
   a processing chamber for bonding a first package component and a second package component;
   a bonding head disposed in the processing chamber, wherein the bonding head comprises a plurality of vacuum tubes communicating with a plurality of vacuum devices;
   a nozzle connected to the bonding head and configured to hold the second package component, wherein the nozzle comprises a plurality of first holes overlapping the vacuum tubes, the nozzle comprises a plurality of second holes offset from the first holes, and the second holes overlap at least two edges of the second package component, wherein at least one of the first holes is away from a projection area of the second package component on the nozzle, and each of the second holes communicates with one of the first holes via a trench; and
   a chuck table disposed in the processing chamber and configured to hold and heat the first package component.

2. The apparatus as claimed in claim 1, wherein the chuck table comprises a plurality of pins configured to hold the first package component, and the pins are movable over a top surface of the chuck table.

3. The apparatus as claimed in claim 1, further comprising a heating module disposed in the processing chamber and configured to heat the second package component, wherein the heating module heats the second package component before the second package component is positioned over the chuck table.

4. The apparatus as claimed in claim 3, further comprising a cooling module connected to the heating module and configured to control a temperature of the heating module.

5. The apparatus as claimed in claim 3, wherein the heating module emits infrared radiation to heat the second package component, and a wavelength of the infrared radiation is in a range of 760 nm to 1 mm.

6. The apparatus as claimed in claim 1, wherein the chuck table comprises a temperature-control element configured to control a temperature of the chuck table.

7. The apparatus as claimed in claim 1, wherein a bottom surface of the bonding head is exposed from the trench.

8. An apparatus for forming a package structure, comprising:
- a processing chamber for bonding a first package component and a second package component;
- a bonding head disposed in the processing chamber, wherein the bonding head comprises a first vacuum tube and a second vacuum tube, the first vacuum tube communicates with a first vacuum device, the second vacuum tube communicates with a second vacuum device, and the first vacuum device and the second vacuum device operate independently;
- a nozzle connected to the bonding head and configured to hold the second package component, wherein the nozzle comprises a plurality of first holes overlapping the first vacuum tube and the second vacuum tube and a plurality of second holes communicating with the first holes via a plurality of trenches, and a top surface of the trenches is substantially level with a top surface of the nozzle; and
- a chuck table disposed in the processing chamber and configured to hold and heat the first package component.

9. The apparatus as claimed in claim 8, wherein the second holes overlap at least two edges of the second package component.

10. The apparatus as claimed in claim 9, wherein the trenches extend along an interface between the bonding head and the nozzle.

11. The apparatus as claimed in claim 8, further comprising:
- a heating module disposed in the processing chamber configured to heat the second package component, wherein the heating module heats the second package component before the second package component is positioned over the chuck table; and
- a cooling module connected to the heating module and configured to control a temperature of the heating module.

12. The apparatus as claimed in claim 8, wherein the chuck table comprises a plurality of pins configured to hold the first package component over a top surface of the chuck table, and the pins are movable.

13. The apparatus as claimed in claim 12, wherein each of the pins has an opening communicating with a vacuum device.

14. The apparatus as claimed in claim 8, wherein the chuck table comprises a temperature-control element configured to control a temperature of the chuck table.

15. An apparatus for forming a package structure, comprising:
- a processing chamber for bonding a first package component and a second package component;
- a chuck table for receiving the first package component and holding the first package component in the processing chamber, wherein the chuck table comprises a plurality of pins movable over a top surface of the chuck table;
- a carrier for transferring the first package component to the chuck table, wherein the pins move away from the top surface of the chuck table for receiving the first package component from the carrier;
- a bonding head disposed in the processing chamber, wherein the bonding head comprises a plurality of vacuum tubes communicating with a plurality of vacuum devices; and
- a nozzle connected to the bonding head and configured to hold the second package component and align the second package component with the first package component over the chuck table, wherein the nozzle comprises:
- a plurality of first holes overlapping the vacuum tubes;
- a first plurality of second holes communicating with one of the first holes via a first plurality of trenches; and
- a second plurality of second holes communicating with another of the first holes via a second plurality of trenches, wherein the first plurality of second holes and the second plurality of second holes overlap opposite edges of the second package component.

16. The apparatus as claimed in claim 15, wherein the pins comprises a base portion and a top portion over the base portion, and the top portion is wider than the base portion in a direction parallel to the top surface of the chuck table.

17. The apparatus as claimed in claim 15, wherein the pins are movable in a direction perpendicular to the top surface of the chuck table.

18. The apparatus as claimed in claim 15, wherein the chuck table comprises a temperature-control element configured to control a temperature of the chuck table, and a width of the temperature-control element is substantially the same as a width of the first package component.

19. The apparatus as claimed in claim 15, wherein the pins have a T-shaped profile when viewed in a direction parallel to the top surface of the top surface of the chuck table.

20. The apparatus as claimed in claim 15, wherein the first plurality of trenches and the second plurality of trenches are away from a projection area of the second package component on the nozzle.

* * * * *